United States Patent
Park et al.

(10) Patent No.: US 9,285,890 B2
(45) Date of Patent: Mar. 15, 2016

(54) TOUCH SENSOR INCLUDING ELECTROSTATIC DISCHARGE PATTERN

(71) Applicant: Samsung Display Co., Ltd., Yongin (KR)

(72) Inventors: Mi-Ae Park, Hwaseong-si (KR); Sung Ku Kang, Suwon-si (KR); Jung-Yun Kim, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 112 days.

(21) Appl. No.: 14/164,811

(22) Filed: Jan. 27, 2014

(65) Prior Publication Data

US 2015/0083568 A1 Mar. 26, 2015

(30) Foreign Application Priority Data

Sep. 24, 2013 (KR) .......................... 10-2013-0113514

(51) Int. Cl.
*H03K 17/975* (2006.01)
*G06F 3/02* (2006.01)
*H02H 9/04* (2006.01)
*H03K 17/96* (2006.01)

(52) U.S. Cl.
CPC .............. *G06F 3/0202* (2013.01); *H02H 9/046* (2013.01); *H03K 17/9622* (2013.01); *H03K 2017/9602* (2013.01); *H03K 2217/960705* (2013.01)

(58) Field of Classification Search
CPC .................. G06F 3/044; G06F 3/0412; G06F 2203/04103; G06F 3/0416; G06F 3/0202; G06F 3/041; H03K 2217/960705; H03K 17/962; H03K 17/9622; H03K 2017/9602
USPC ........................................................ 200/600
See application file for complete search history.

(56) References Cited

U.S. PATENT DOCUMENTS

| | | | | |
|---|---|---|---|---|
| 5,929,829 | A * | 7/1999 | Pitt ................................ | 345/87 |
| 8,035,298 | B2 * | 10/2011 | Jeong et al. ................... | 313/506 |
| 8,184,105 | B2 * | 5/2012 | Lin et al. ....................... | 345/173 |
| 2005/0023614 | A1 * | 2/2005 | Lai ................................. | 257/360 |
| 2008/0179112 | A1 * | 7/2008 | Qin et al. ..................... | 178/18.06 |
| 2009/0262094 | A1 * | 10/2009 | Lin ................................ | 345/174 |
| 2012/0186966 | A1 * | 7/2012 | Chang et al. .................. | 200/600 |
| 2013/0113711 | A1 | 5/2013 | Nien et al. | |

FOREIGN PATENT DOCUMENTS

| | | |
|---|---|---|
| JP | 2010-218542 | 9/2010 |
| JP | 2012-155514 | 8/2012 |
| JP | 2012-155607 | 8/2012 |
| KR | 10-1092500 | 12/2011 |
| KR | 10-2012-0001406 | 1/2012 |

* cited by examiner

*Primary Examiner* — Kyung Lee
(74) *Attorney, Agent, or Firm* — H.C. Park & Associates, PLC

(57) ABSTRACT

A touch sensor including an electrostatic discharge pattern. The touch sensor includes: touch electrodes disposed in a touch region of a touch panel and configured to sense a touch; and a connection wire disposed in the touch region and connected to the touch electrode. A width of the connection wire is less than a width of the touch electrode, and an electrostatic discharge pattern is disposed adjacent a bottleneck portion, which is a part where the touch electrode and the connection wire are connected to each other.

20 Claims, 14 Drawing Sheets

TOUCH SENSOR INCLUDING ELECTROSTATIC DISCHARGE PATTERN

CROSS-REFERENCE TO RELATED APPLICATION

This application claims priority from and the benefit of Korean Patent Application No. 10-2013-0113514, filed on Sep. 24, 2013, which is hereby incorporated by reference for all purposes as if fully set forth herein.

BACKGROUND

1. Field

Exemplary embodiments of the present invention relate to a touch sensor. More particularly, exemplary embodiments of the present invention relate to a touch sensor including an electrostatic discharge pattern.

2. Discussion of the Background

A display device, such as a liquid crystal display, an organic light emitting display, a portable transmission device, and other information processing devices, executes functions by using various input devices. Recently, an input device including a touch panel has been frequently used.

A touch sensing function detects a change in pressure applied to a screen by a display, charge, light, and the like, when a user approaches or contacts the screen with his/her finger, a touch pen, or the like, so as to write characters or draw pictures, thereby determining whether objects approach or contact the screen, along with contact information regarding the contact positions, and the like. The display may receive an image signal and display an image based on the contact information.

The touch sensing function may be implemented by a touch sensor. The touch sensor may be classified into various touch sensing types such as a resistive type, a capacitive type, an electromagnetic resonance (EMR) type, or an optical sensing type.

In the case of a resistive type of touch sensor, two electrodes spaced apart from and facing each other may contact each other as a result of pressure exerted by an external object. When the two electrodes contact each other, the contact positions and the like may be determined by recognizing a change in voltage depending on a change in resistance at the contact position.

The capacitive type of touch sensor includes a detection capacitor formed of a detection electrode capable of transferring a detection signal and detecting a change in capacitance of the detection capacitor generated when a conductor, such as a finger, approaches the sensor to determine whether contact has occurred, the contact positions, and the like.

The contact sensing sensor may be formed in the touch panel to be attached on the display device (an add-on cell type), may be formed outside a substrate of the display device (an on-cell type), and may be formed inside the display device (an in-cell type). The display device, including the contact sensing sensor, detects whether the finger of the user or the touch pen contacts the screen and the contact position information, thereby displaying the image according thereto.

These various touch sensors are disposed in the touch region, and may include touch electrodes to sense the touch and connection wire connected to the touch electrode. The touch region may overlap the display area. The connection wire may transmit a sensing input signal to the touch electrode or a sensing output signal of the touch electrode generated according to the touch to a sensing signal controller.

However, if any static electricity is accumulated at the touch electrode disposed in the touch region of the touch sensor, the touch electrode may malfunction, and touch sensing may not be performed in the corresponding portion.

The above information disclosed in this Background section is only for enhancement of understanding of the background of the invention and, therefore, it may contain information that does not constitute prior art.

SUMMARY

Exemplary embodiments of the present invention provide a touch sensor normally sensing a touch in all regions of the touch sensor by preventing a touch electrode and a connection wire of the touch sensor from being damaged by static electricity accumulated in the touch sensor.

Additional features of the invention will be set forth in the description which follows, and in part will become apparent from the description, or may be learned by practice is of the invention.

An exemplary embodiment of the present invention discloses a touch sensor including: touch electrodes disposed in a touch region of a touch panel and configured to sense a touch; and a connection wire disposed in the touch region and connected to the touch electrode, wherein a width of the connection wire is less than a width of the touch electrode. An electrostatic discharge pattern is disposed adjacent a bottleneck portion on the touch panel, which is a part where the touch electrode and the connection wire are connected to each other.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
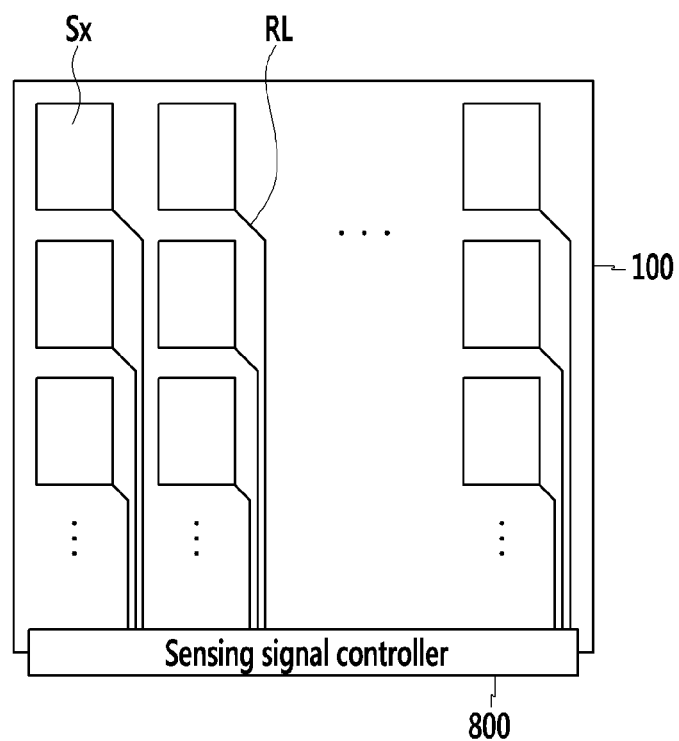
FIG. 1 is a layout view of a touch sensing device including a touch sensor according to an exemplary embodiment of the present invention.

The invention is described more fully hereinafter with reference to the accompanying drawings, in which exemplary embodiments of the invention are shown. This invention may, however, be embodied in many different forms and should not be construed as is limited to the exemplary embodiments set forth herein. Rather, these exemplary embodiments are provided so that this disclosure is thorough, and will fully convey the scope of the invention to those skilled in the art. In the drawings, the size and relative sizes of elements may be exaggerated for clarity. Like reference numerals in the drawings denote like elements.

Throughout this specification and the claims that follow, when it is described that an element is "coupled" to another element, the element may be "directly coupled" to the other element or "electrically coupled" to the other element through a third or additional intervening elements. In contrast, when an element is referred to as being "directly coupled to" another element, there are no intervening elements present. As used herein, the term "and/or" includes any and all combinations of one or more of the associated listed items. It will be understood that for the purposes of this disclosure, "at least one of X, Y, and Z" can be construed as X only, Y only, Z only, or any combination of two or more items X, Y, and Z (e.g., XYZ, XYY, YZ, ZZ). In addition, unless explicitly described to the contrary, the word "comprise" and variations, such as "comprises" or "comprising", will be understood to imply the inclusion of stated elements but not the exclusion of any other elements.

A touch sensing device and a touch sensor, including an electrostatic discharge pattern according to an exemplary embodiment of the present invention, will be described with reference to FIG. 1 to FIG. 4.

A touch sensing device shown in FIG. 1 includes a touch sensor and a sensing signal controller 800 connected to the touch sensor.

A touch sensor according to an exemplary embodiment of the present invention is capable of sensing a touch of an external object, and may be a touch sensor of various types. However, a capacitive type of touch sensor is described as an example in the present exemplary is embodiment.

The touch sensor is included in a display panel or a separate touch panel, and senses a touch. In the present exemplary embodiment, an example of the touch sensor included in the touch panel 100 is described. A "touch" is herein defined as a case in which an external object approaches the display panel or the touch screen, as well as a case of direct contact with the display panel or the touch panel.

The touch sensor according to an exemplary embodiment of the present invention includes touch electrodes Sx positioned in an active area, and connection wires RL connected to the touch electrodes Sx. The active area, herein defined as a region where the touch is applied and the touch is sensed, may overlap a display area displaying an image in the case of a display panel. In the case of the touch panel 100, the active area may be the touch region, and when the touch panel is installed in the display panel, the touch region may overlap the display area. The active region is referred to as a touch region (a touch area).

The touch electrodes Sx may be arranged in a matrix shape, and they may be formed in a same layer, when viewed in cross-section. Each touch electrode Sx may be made of a transparent conductive material, such as ITO (indium tin oxide), IZO (indium zinc oxide), metal nanowires, a conductive polymer, or a thin metal layer, but is not limited thereto. When the touch electrode Sx includes a metal, the metal may include silver (Ag) or copper (Cu), but is not limited thereto.

As shown in FIG. 1, a shape of the touch electrode Sx may be a quadrangle, such as a rhombus, but the shape is not limited thereto and various shapes may be provided. Particularly, referring to FIG. 3, the touch electrode Sx may include protrusions and depressions formed at sides thereof, to increase touch sensitivity. When the side of the touch electrode Sx is includes protrusions and depressions, sides of the protrusions and depressions of the adjacent touch electrodes Sx are engaged with each other.

A length of one side of the touch electrode Sx may be about several mm, for example, equal to or less than about 10 mm, and in detail about 4 mm to about 5 mm. However, the size of the touch electrode Sx may be controlled according to the touch sensing resolution.

Touch electrodes Sx are separated in the touch region, and different touch electrodes Sx may be connected to the sensing signal controller 800 through different connection wires RL.

The touch electrodes Sx receive the sensing input signal from the sensing signal controller 800 through the connection wires RL, and generate and output a sensing output signal according to the contact to the sensing signal controller 800. Each touch electrode Sx forms a self-sensing capacitor to be charged with a preselected charge amount after receiving the sensing input signal. When an external object, such as a finger, makes contact, the charge amount of the self-sensing capacitor is changed such that a sensing output signal different from the input sensing input signal may be output. Accordingly, contact information, such as contact existence and contact position may be obtained through the generated sensing output signal.

The connection wire RL connects the touch electrode Sx and the sensing signal controller 800 to transmit the sensing input signal or the sensing output signal. The connection wires RL may be positioned in the same layer as the touch electrodes Sx, and may be formed of the same material as the touch electrodes Sx. However, the connection wires RL may be positioned in a different layer than the touch electrodes Sx, and may be connected to the touch electrodes Sx through a separate connection.

In the exemplary embodiment shown in FIG. 1, the number of connection wires RL disposed between the columns of touch electrodes Sx is increased nearer the sensing signal controller 800. Accordingly, the size of the touch electrode Sx may be decreased nearer the sensing signal controller 800.

A width of the connection wires RL may be equal to or greater than about 10 um, and equal to or less than about 100 um, but it is not limited thereto. Accordingly, the connection part of the touch electrode Sx and the connection wires RL forms a "bottleneck portion", at which the width of the connection part is suddenly increased or decreased.

The sensing signal controller 800 is connected to the touch electrode Sx of the touch panel 100 to transmit the sensing input signal to the touch electrode Sx and to receive the sensing output signal. The sensing signal controller 800 processes the sensing output signal to generate contact information, such as contact existence and contact position.

The sensing signal controller 800 may be positioned on a separate printed circuit board (PCB) from the touch panel 100. The sensing signal controller 800 may be connected to the touch panel 100, may be attached on the touch panel 100 as a type of an IC chip or a TCP type, or may be integrated on the touch panel 100.

Figure 2:
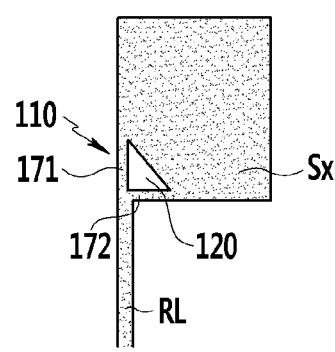
FIG. 2 is a top plan view of a touch electrode and connection wiring included in a touch sensor according to an exemplary embodiment of the present invention.

Referring to FIG. 2, the touch sensor according to an exemplary embodiment of the present invention includes an electrostatic discharge pattern 110. The electrostatic discharge pattern 110 may be formed in the touch electrode Sx, and includes electrostatic discharge paths 171 and 172 positioned adjacent the connection part of the touch electrode Sx and the connection wire RL, that is, the bottleneck portion. The electrostatic discharge paths include first electrostatic discharge paths 171 and second electrostatic discharge paths 172. Each of the first electrostatic discharge path 171 and the second electrostatic discharge path 172 may be directly connected to the connection wire RL. The width of the first electrostatic discharge path 171 or the second electrostatic discharge path 172 may be equal to or less than the width of the connection wire RL.

Figure 3:
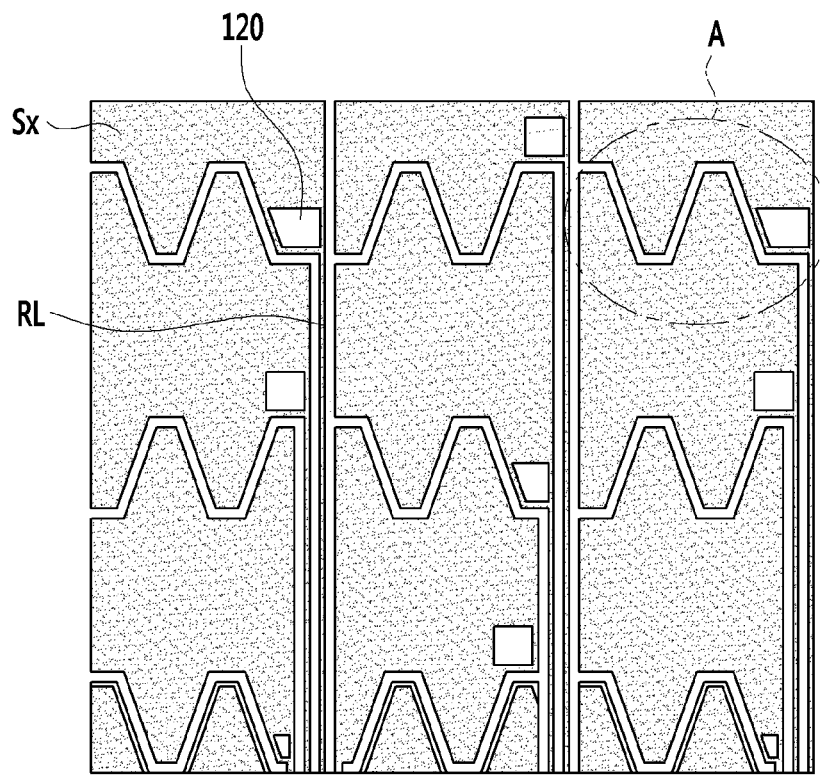
FIG. 3 is a layout view of a touch electrode and connection wiring included in a touch sensor according to an exemplary embodiment of the present invention.
Figure 4:
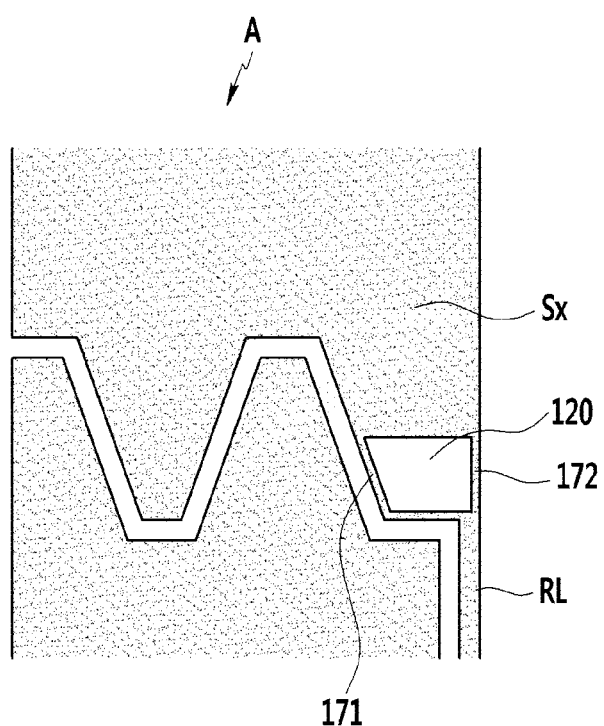
FIG. 4 is a partially enlarged view of the touch sensor shown in FIG. 3.

An opening 120 is formed in the touch electrode Sx between the first electrostatic discharge path 171 and the second electrostatic discharge path 172, which are adjacent to each other. A shape of the opening 120, as shown in FIG. 2, may be triangular, or as shown in FIG. 3 and FIG. 4, may be a quadrangle, but is not limited thereto, and various other shapes may be utilized.

In general, to prevent main electrical circuits of the display area from being damaged and malfunctioning because of static electricity, an electrostatic discharge circuit dispersing the static electricity into a peripheral area of the display area and charging electrostatic charges to be firstly eliminated under an overvoltage is provided. However, a conventional electrostatic discharge circuit is not positioned in the touch region displaying the image such that the touch electrode Sx or the connection wire RL is broken in the bottleneck portion by the accumulated static electricity when the static electricity is discharged and, as a resultant, the operstion of the touch sensor may be lost in the corresponding part.

By forming the electrostatic discharge pattern 110 realized by more than one electrostatic discharge path, including the first electrostatic discharge path 171 and second electrostatic discharge path 172 near the bottleneck portion, as shown in the present exemplary embodiment, accumulated static electricity is dispersed into both of the electrostatic discharge paths 171 and 172. Even if one of the electrostatic discharge paths 171 and 172 is broken and/or disconnected, the electrical connection between the touch electrode Sx and the connection wire RL may be maintained through the remaining electrostatic discharge path 171 or 172 such that the touch sensor of the corresponding part may function normally.

A touch sensor including the electrostatic discharge pattern 110 will now be described with reference to FIG. 5 and FIG. 6. The same reference numerals will be used to refer to the same constituent elements throughout the exemplary embodiments, and detailed descriptions of the same elements will be omitted in order to avoid redundancy.

The touch sensor according to the present exemplary embodiment is similar to the above-described exemplary embodiment, except for the electrostatic discharge pattern 110 included in the touch sensor. The touch sensor according to the present exemplary embodiment includes touch electrodes Sx disposed in the touch region and connection wires RL connected to the touch electrodes Sx. The connection part of the touch electrode Sx and the connection wire RL forms the bottleneck portion where the width of the connection part is suddenly decreased or increased, and includes the electrostatic discharge pattern 110 positioned adjacent the bottleneck portion.

The electrostatic discharge pattern 110 according to the present exemplary embodiment is disposed adjacent the connection part of the touch electrode Sx and the connection wire RL, that is, the bottleneck portion, and includes at least one of electrostatic discharge protruding portions ES, ES1, and ES2, which protrude from the touch electrode Sx. As shown in FIG. 5, the electrostatic discharge protruding portions ES, ES1, and ES2 may include a first electrostatic discharge protruding portion ES1 and a second electrostatic discharge protruding portion ES2 protruding from one touch electrode Sx. Additionally, as shown in FIG. 6, one electrostatic discharge protruding portion ES may protrude from one touch electrode Sx.

The electrostatic discharge protruding portions ES, ES1, and ES2 protrude from the touch electrode Sx adjacent the bottleneck portion, and are substantially parallel to the edge side of the touch electrode Sx or the connection wire RL, and may be extended according to a is gap between adjacent touch electrodes Sx. As shown in FIG. 5, when electrostatic discharge protruding portions ES1 and ES2 protrude from one touch electrode Sx, they may extend in different directions.

Each width of the electrostatic discharge protruding portions ES, ES1, and ES2 may be equal to or less than the width of the connection wires RL. The lengths of the electrostatic discharge protruding portions ES, ES1, and ES2 may be appropriately adjusted.

In the present exemplary embodiment, when forming the electrostatic discharge pattern 110 realized by at least one of the electrostatic discharge protruding portions ES, ES1, and ES2 adjacent the bottleneck portion where the touch electrode Sx and the connection wire RL are connected, any inflowing static electricity is induced by at least one of the electrostatic discharge protruding portions ES, ES1, and ES2 such that the electrostatic discharge protruding portions ES, ES1, and ES2 are broken first by any overvoltage. Accordingly, the connection wires RL may be prevented from being broken by the static electricity such that the electrical connection between the touch electrode Sx and the connection wires RL may be maintained, and the touch sensor of the corresponding part may function normally.

The touch sensor including the electrostatic discharge pattern 110 according to an exemplary embodiment of the present invention will now be described with reference to FIG. 7 and FIG. 8.

Figure 7:
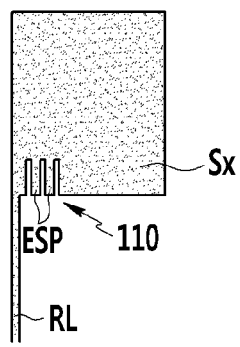
FIG. 7 is a top plan view of a touch electrode and connection wiring included in a touch sensor according to an exemplary embodiment of the present invention.
Figure 8:
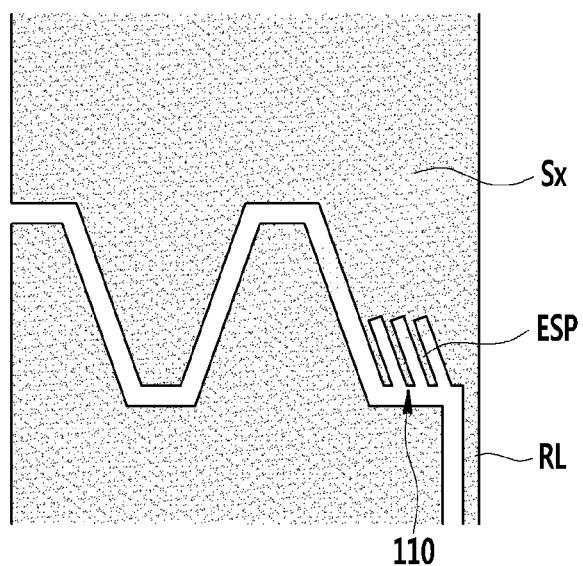
FIG. 8 is a layout view of a touch electrode and connection wiring included in a touch sensor according to an exemplary embodiment of the present invention.

Referring to FIGS. 7 and 8, the touch sensor is similar to the touch sensor of the previously described exemplary embodiment, except that the electrostatic discharge pattern 110 included in the touch sensor differs. That is, the touch sensor according to the present exemplary embodiment includes connection wires RL connected to touch electrodes Sx disposed in the touch region, the connection part of the touch electrode Sx and the connection wire RL is forms the bottleneck portion in which the width is quickly increased and decreased, and the electrostatic discharge pattern 110 is positioned adjacent the bottleneck portion.

The electrostatic discharge pattern 110 according to the present exemplary embodiment includes at least one electrostatic discharge comb pattern ESP formed at the touch electrode Sx adjacent the connection part of the touch electrode Sx and the connection wire RL, that is, the bottleneck portion.

The electrostatic discharge comb pattern ESP extends from the inside of the touch electrode Sx to the outside thereof, and a gap of a preselected width is formed between portions of the electrostatic discharge comb pattern ESP or between the electrostatic discharge comb pattern ESP and the side of the main body of the touch electrode Sx. The gap between the portions of the electrostatic discharge comb pattern ESP or between the electrostatic discharge comb pattern ESP and the main body of the touch electrode S extends to the outer space of the touch electrode Sx.

The electrostatic discharge comb pattern ESP may extend substantially parallel to the edge side of the touch electrode Sx adjacent the bottleneck portion, but it is not limited thereto. The end part of the electrostatic discharge comb pattern ESP is not connected to any other parts, including the connection wires RL. The individual portions of the comb pattern ESP may be formed to extend substantially parallel to each other.

The width of each of the portions of the electrostatic discharge comb patterns ESP may be equal to or less than the width of the connection wires RL. The length of the portions of the electrostatic discharge comb pattern ESP may be appropriately adjusted.

In the present exemplary embodiment, when forming the electrostatic discharge pattern 110 realized by at least one electrostatic discharge comb pattern ESP in the touch is electrode Sx adjacent the bottleneck portion where the touch electrode Sx and the connection wire RL are connected, any inflowing static electricity is induced by at least one portion of the electrostatic discharge comb pattern ESP such that the electrostatic discharge comb pattern ESP may be broken first by any overvoltage. Accordingly, the connection wire RL may be prevented from being broken by the static electricity such that the electrical connection between the touch electrode Sx and the connection wire RL may be maintained, and the touch sensor of the corresponding part may function normally.

A touch sensing device and the touch sensor including the electrostatic discharge pattern 110 according to an exemplary embodiment of the present invention will now be described with reference to FIG. 9 to FIG. 13.

The touch sensing device according to an exemplary embodiment of the present invention is similar to the touch sensing device according to the exemplary embodiment shown in FIG. 1 to FIG. 4, except that the structure of the touch sensor and the operation method thereof may differ.

Referring to FIGS. 9-13, the touch sensing device includes the touch sensor and the sensing signal controller 800 connected to the touch sensor, the touch sensor included in the display panel, or the touch panel 100 sensing the touch.

The touch sensor according to an exemplary embodiment of the present invention includes input touch electrodes Tx11, Tx12, Tx21, Tx22, Tx31, . . . and a output touch electrodes Rx1, Rx2, . . . , Rxm positioned in the touch region displaying the images and connection wires RL connected to the input touch electrodes Tx11, Tx12, Tx21, Tx22, Tx31, . . . .

The input touch electrodes Tx11, Tx12, Tx21, Tx22, Tx31, . . . and the output touch electrodes Rx1, Rx2, . . . , Rxm may be disposed in the same layer.

The input touch electrodes Tx11, Tx12, Tx21, Tx22, Tx31, . . . may be arranged in columns, and the input touch electrodes Tx11, Tx12, Tx21, Tx22, Tx31, . . . may be formed in each column.

The output touch electrodes Rx1, Rx2, . . . , Rxm are arranged in the row direction, and the output touch electrodes Rx1, Rx2, . . . , Rxm may form one wiring shape connected in the column direction However, the present invention is not limited thereto, and the output touch electrodes Rx1, Rx2, . . . , Rxm may be formed in each column and may be connected to each other.

Figure 9:
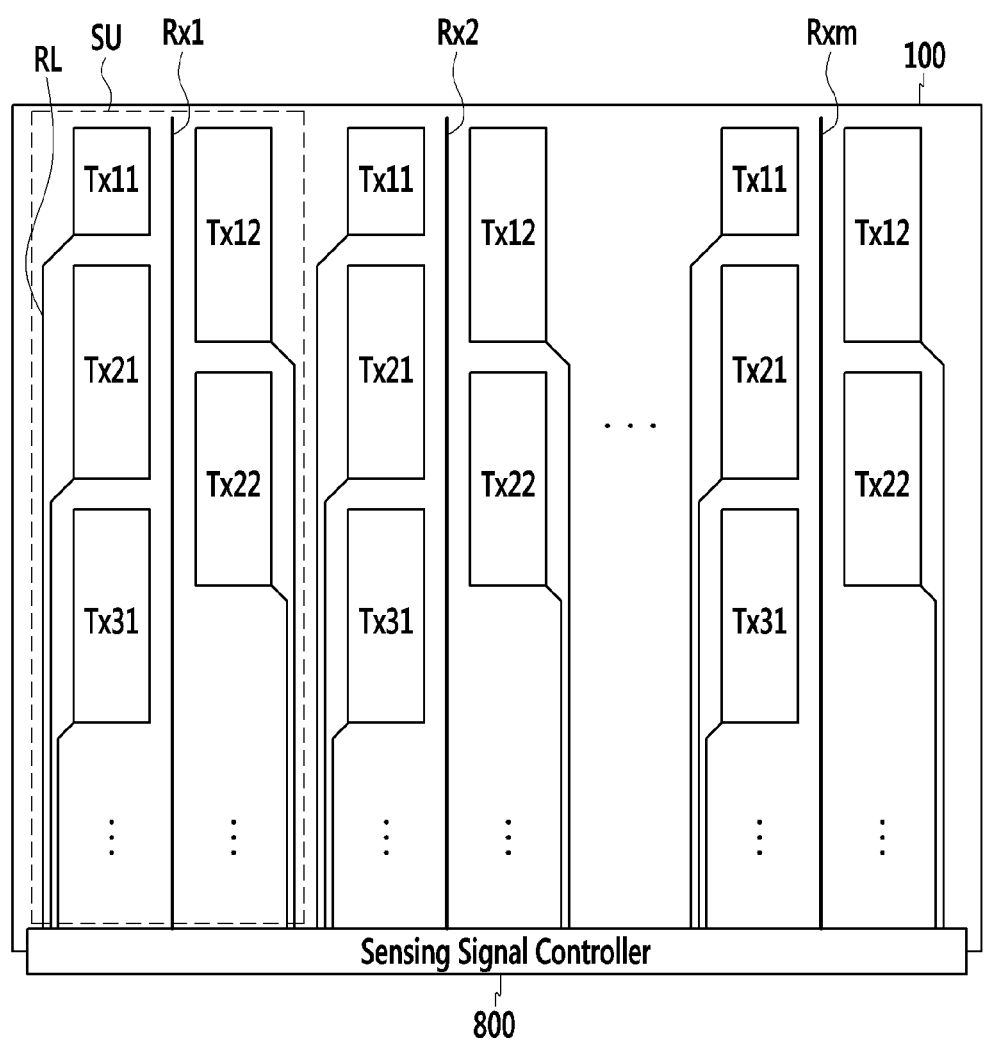
FIG. 9 is a layout view of a touch sensing device including a touch sensor according to an exemplary embodiment of the present invention.

Referring to FIG. 9, input touch electrodes Tx11, Tx12, Tx21, Tx22, Tx31, . . . are arranged in a pair of columns, and one of the output touch electrodes Rx1, Rx2, . . . , Rxm may be disposed therebetween. The pairs of columns of input touch electrodes Tx11, Tx12, Tx21, Tx22, Tx31, . . . and the output touch electrodes Rx1, Rx2, . . . , Rxm therebetween together form one touch sensing set (SU), and may be repeatedly disposed in the row direction.

In one touch sensing set SU, the input touch electrodes Tx11, Tx12, Tx21, Tx22, Tx31, . . . of two columns of the input touch electrodes Tx11, Tx12, Tx21, Tx22, Tx31, . . . are not aligned in the row direction, but may be alternately disposed. For example, the boundaries between the left input touch electrodes Tx11, Tx21, Tx31, . . . and the boundaries between the right input touch electrode Tx12, Tx22, Tx32, . . . are not aligned in the row direction, but may be alternately disposed. Accordingly, in one touch sensing set SU, the touch sensing resolution in the column direction may be increased as compared with the size of the input touch electrodes Tx11, Tx12, Tx21, Tx22, Tx31, . . . . That is, the touch coordinates in the column direction may be further finely sensed than a number of the input touch electrodes Tx11, Tx12, Tx21, Tx22, Tx31, . . . disposed in one column of the input touch electrodes Tx11, Tx12, Tx21, Tx22, Tx31, . . . .

Hereafter, for convenience of description, the input touch electrodes Tx11, Tx12, Tx21, Tx22, Tx31, . . . may be simply indicated by an input touch electrode Tx and the output touch electrodes Rx1, Rx2, . . . , Rxm may be simply indicated by an output touch electrode Rx.

The input touch electrode Tx and the output touch electrode Rx may be made of a transparent conductive material, such as ITO (indium tin oxide), IZO (indium zinc oxide), the metal nanowires, the conductive polymer, and the thin metal layer, but is not limited thereto. When the input touch electrode Tx and the output touch electrode Rx include the metal, the metal may include silver (Ag) or copper (Cu), but is not limited thereto.

As shown in FIG. 9, the shape of the input touch electrode Tx may be polygonal, and as shown in FIG. 10 to FIG. 13, in order to increase touch sensitivity, protrusions and depressions may be formed on the edge side. As shown in FIG. 10 to FIG. 13, when the edge side of the input touch electrode Tx includes the protrusions and depressions, the output touch electrode Rx adjacent thereto may include protrusions that are engaged with the protrusions and depressions of the input touch electrode Tx.

The length of one side of the input touch electrode Tx may be about several mm, for example, equal to or less than about 10 mm, and in detail about 4 mm to about 5 mm. The size of the input touch electrode Tx may be adjusted according to the touch sensing resolution.

Referring to FIG. 10 to FIG. 13, dummy patterns Dp may be disposed between the adjacent input touch electrodes Tx or between the adjacent input touch electrodes Tx and output touch electrodes Rx. The dummy pattern Dp is not connected to the input touch electrode Tx or the output touch electrode Rx, and fills a space where the input touch electrode Tx or the output touch electrode Rx is not formed, thereby preventing the space from being visible to the is outside. The dummy patterns Dp may be closely arranged according to the space between the adjacent input touch electrodes Tx or and the space between the adjacent input touch electrode Tx and output touch electrode Rx, and the shape of each dummy pattern Dp may be rectangular, although it is not limited thereto.

The input touch electrodes Tx are separated from each other in the touch region, and different input touch electrodes Tx may be connected to the sensing signal controller 800 through different connection wires RL.

The input touch electrode Tx according to the present exemplary embodiment receives the sensing input signal from the sensing signal controller 800 through the connection wire RL, and the output touch electrode Rx may generate and transmit the sensing output signal to the sensing signal controller 800 through the connection wire RL. The adjacent input touch electrode Tx and output touch electrode Rx form a mutual sensing capacitor. The mutual sensing capacitor receives the sensing input signal through the input touch electrode Tx to be charged with a preselected charge amount, and may output a charge amount change produced by the contact of the external object as the sensing output signal. Accordingly, the sensing signal controller 800 may obtain contact information, such as the contact existence and the contact position, through the generated sensing output signal.

Figure 12:
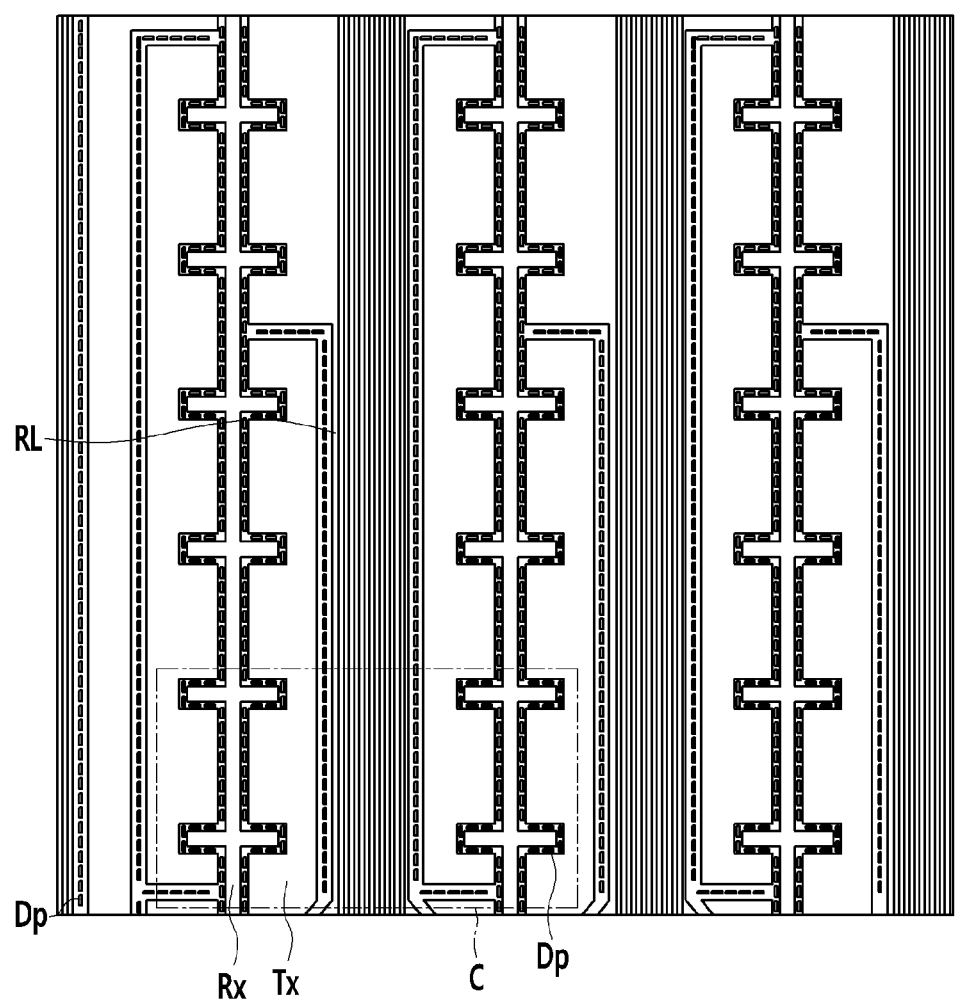
FIG. 12 is a partial layout view of a touch electrode and connection wiring of a touch sensor according to an exemplary embodiment of the present invention.

The connection wire RL may connect the input touch electrode Tx and the sensing signal controller 800 to transmit the sensing input signal, as shown in FIG. 12. The connection wires RL may be disposed in the same layer as the input touch electrodes Tx, and may be formed of the same material as the touch electrodes Sx. However, the present invention is not limited thereto, and the connection wires RL may be positioned in a different layer from the input touch electrodes Tx, and may be connected to the input touch electrodes Tx through a is separate connection.

Figure 10:
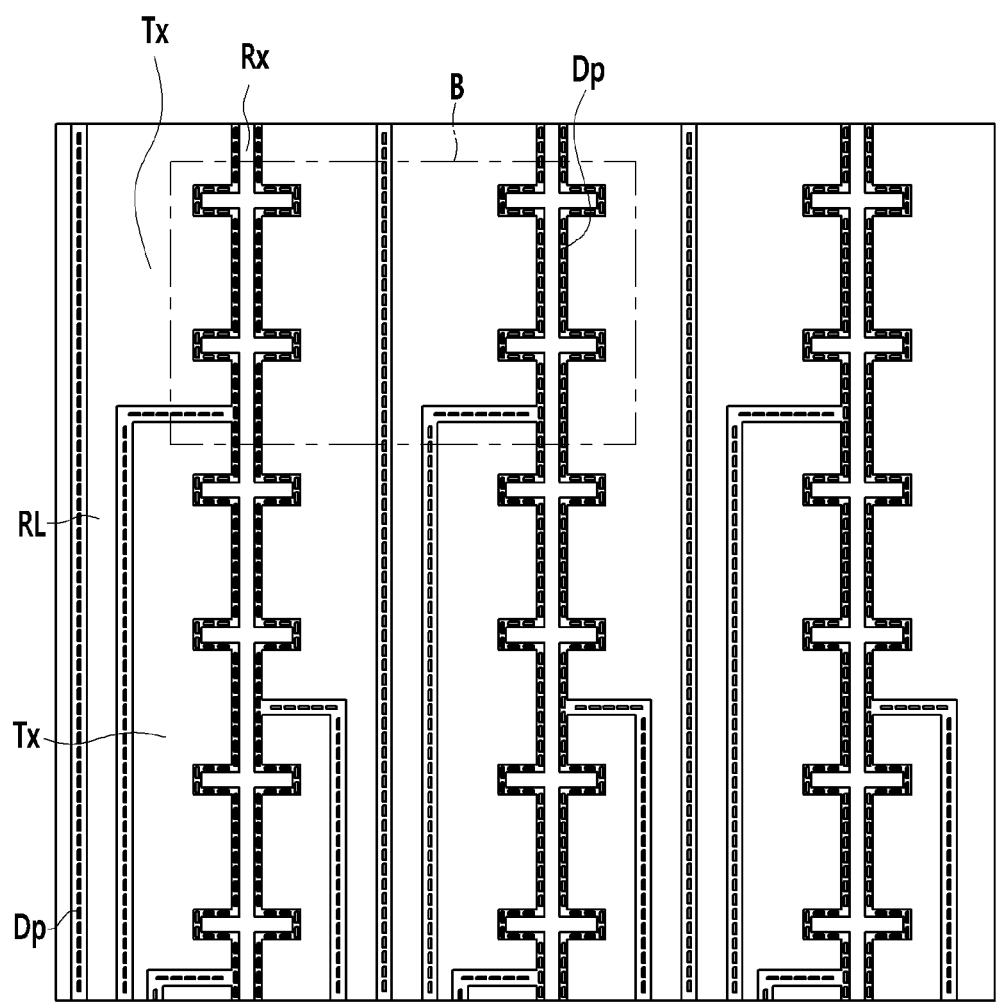
FIG. 10 is a partial layout view of a touch electrode and connection wiring of a touch sensor according to an exemplary embodiment of the present invention.

FIG. 10 shows a touch sensor portion relatively far from the sensing signal controller 800 among the touch sensor, and FIG. 12 shows a touch sensor portion relatively close to the sensing signal controller 800. Referring to FIG. 10 and FIG. 12, a number of connection wires RL disposed between columns of input touch electrodes Sx is increased nearer the sensing control controller 800. According, the size of the input touch electrode Tx may be decreased near the sensing signal controller 800.

The width of the connection wires RL may be equal to or greater than about 10 um and equal to or less than 100 um, but it is not limited thereto. Accordingly, the connection part of the input touch electrode Tx and the connection wires RL form the bottleneck portion in which the width of the connection part is suddenly increased or decreased.

Figure 11:
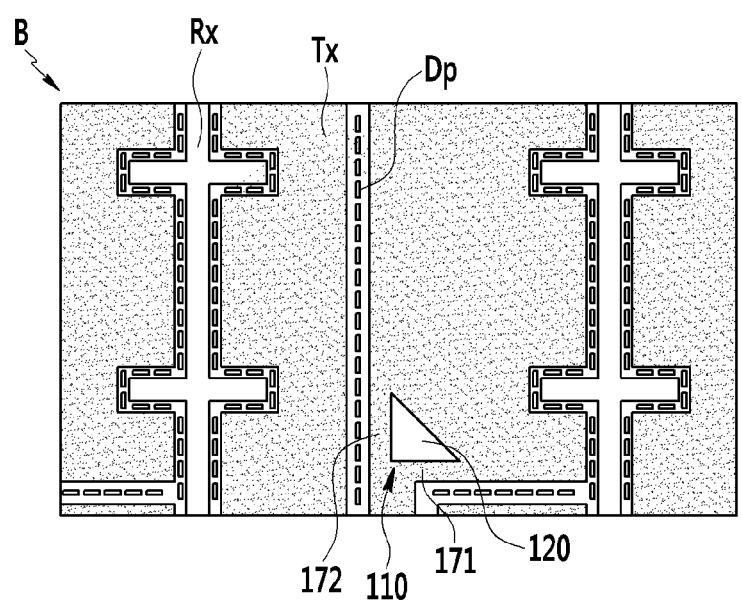
FIG. 11 is a partially enlarged view of the touch sensor shown in FIG. 10.
Figure 13:
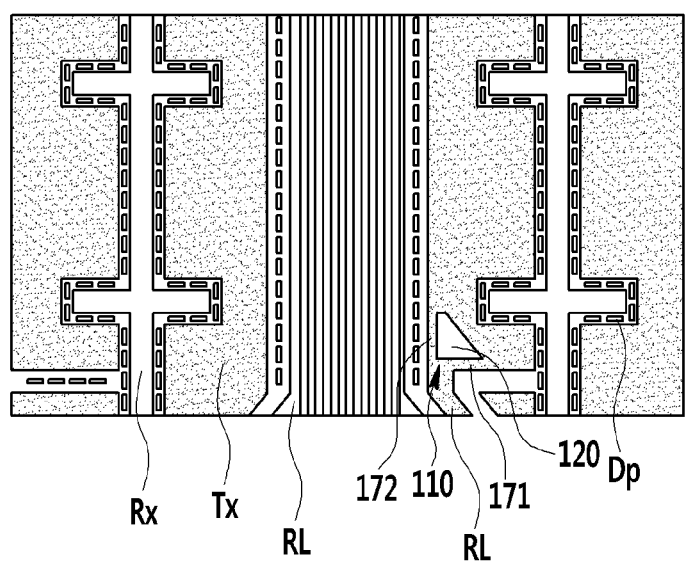
FIG. 13 is a partially enlarged view of the touch sensor shown in FIG. 12.

FIG. 11 is an enlarged view of part 'B' of FIG. 10, and FIG. 13 is an enlarged view of the part 'C' of FIG. 12. Referring to FIG. 11 and FIG. 13, the input touch electrode Tx of the touch sensor includes the electrostatic discharge pattern 110 according previously described. The electrostatic discharge pattern 110 is formed in the input touch electrode Tx, and includes electrostatic discharge paths 171 and 172 positioned adjacent the connection part of the input touch electrode Tx and the connection wires RL, that is, the bottleneck portion. The electrostatic discharge paths include first electrostatic discharge path 171 and second electrostatic discharge path 172. The first electrostatic discharge path 171 and the second electrostatic discharge path 172 may be directly connected to the connection wire RL.

Each width of the first electrostatic discharge path 171 and the second electrostatic discharge path 172 may be equal to or less than the width of the connection wire RL.

An opening 120 formed in the input touch electrode Tx is disposed between the first electrostatic discharge path 171 and the second electrostatic discharge path 172, which are adjacent to each other. The shape of the opening 120, as shown in FIG. 11, may be triangular, and as shown in FIG. 13, may be approximately quadrangular. However, the present invention is not limited thereto, and the opening 120 may have various other shapes.

When the electrostatic discharge pattern 110 realized by more than one electrostatic discharge path including the first electrostatic discharge path 171 and second electrostatic discharge path 172 is disposed adjacent the bottleneck portion, as shown in the present exemplary embodiment, static electricity flowing in from the outside of the touch sensor is dispersed into the electrostatic discharge paths 171 and 172, such that, if one of electrostatic discharge paths 171 and 172 is broken and disconnected, the electrical connection between the touch electrode Sx and the connection wires RL may be maintained through the remaining electrostatic discharge path 171 or 172, thereby allowing the touch sensor of the corresponding part to function normally.

The characteristics of the touch panel according to the exemplary embodiment shown in FIG. 1 to FIG. 4 may be applied to the present exemplary embodiment.

According to another exemplary embodiment of the present invention, in the exemplary embodiment shown in FIG. 9 to FIG. 13, the relative positions of the input touch electrode Tx and the output touch electrode Rx may be exchanged. In this case, the output touch electrode Rx may include the electrostatic discharge paths 171 and 172.

According to still another exemplary embodiment of the present invention, in the exemplary embodiment shown in FIG. 9 to FIG. 13, the output touch electrode Rx may also be divided into a plurality of touch electrodes Rx disposed in each column, and may be connected to is the sensing signal controller 800 through the connection wires RL. In this case, the output touch electrode Rx may also include electrostatic discharge paths 171 and 172.

The touch sensor including the electrostatic discharge pattern 110 according to an exemplary embodiment of the present invention will now be described with reference to FIG. 14, as well as FIG. 9, FIG. 10, and FIG. 12.

Figure 14:
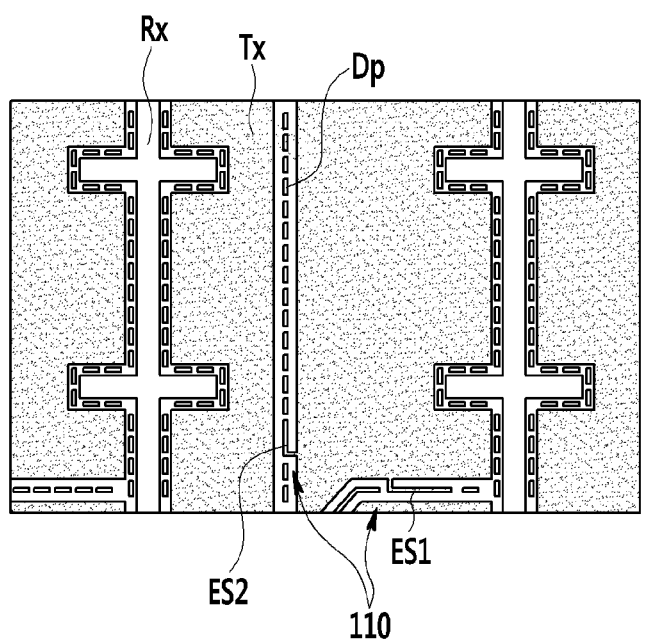
FIG. 14 is a partially enlarged view of the touch sensor shown in FIG. 10.

FIG. 14 is a partial enlarged view of the touch sensor shown in FIG. 10.

The touch sensor according to the present exemplary embodiment is similar to the above-described exemplary embodiment except for the arrangement of the electrostatic discharge pattern 110 included in the touch sensor. That is, the touch sensor according to the present exemplary embodiment includes input touch electrodes Tx and output touch electrodes Rx disposed in the touch region, and connection wires RL connected to input touch electrodes Tx, and the connection part of the input touch electrode Tx and the connection wires RL forms the bottleneck portion, in which the width of the connection part is suddenly decreased or increased and includes the electrostatic discharge pattern 110 positioned adjacent the bottleneck portion.

The electrostatic discharge pattern 110 according to the present exemplary embodiment is disposed near the connection part of the input touch electrode Tx and the connection wires RL, that is, the bottleneck portion, and includes at least one of electrostatic discharge protruding portions ES1 and ES2 protruding from the input touch electrode Tx. As shown in FIG. 14, at least one of the electrostatic discharge protruding portions ES1 and ES2 may include a first electrostatic discharge protruding portion ES1 and a second electrostatic discharge protruding portion ES2 protruding from one input touch electrode Tx.

The electrostatic discharge protruding portions ES1 and ES2 protrude from the input touch electrode Tx adjacent the bottleneck portion, and are substantially parallel to the is edge side of the input touch electrode Tx or the connection wires RL, and may be extended according to the gap between the adjacent input touch electrodes Sx. As shown in FIG. 14, when electrostatic discharge protruding portions ES1 and ES2 protrude from one input touch electrode Tx, the electrostatic discharge protruding portions ES1 and ES2 may extend in different directions.

In the present exemplary embodiment, the electrostatic discharge protruding portions ES1 and ES2 may be formed by connecting one end of the dummy patterns Dp to the input touch electrode Tx.

Each width of the electrostatic discharge protruding portions ES1 and ES2 may be equal to or less than the width of the connection wires RL. The length of the electrostatic discharge protruding portions ES1 and ES2 may be appropriately adjusted.

When forming the electrostatic discharge pattern 110 realized by at least one of electrostatic discharge protruding portions ES1 and ES2 adjacent the bottleneck portion where the input touch electrode Tx and the connection wires RL are connected, static electricity is induced by at least one of the electrostatic discharge protruding portions ES1 and ES2 such that the electrostatic discharge protruding portions ES1 and ES2 may be first broken by any overvoltage. Accordingly, the connection wires RL may be prevented from being broken by the static electricity such that the electrical connection between the input touch electrode Tx and the connection wire RL may be maintained, and the touch sensor of the corresponding part may function normally.

Figure 5:
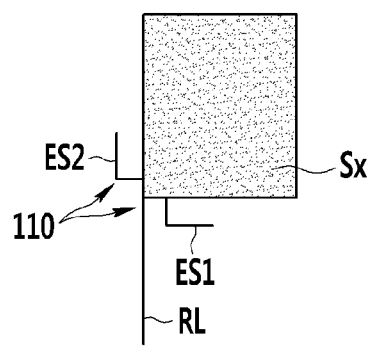
FIG. 5 is a top plan view of a touch electrode and connection wiring included in a touch sensor according to an exemplary embodiment of the present invention.
Figure 6:
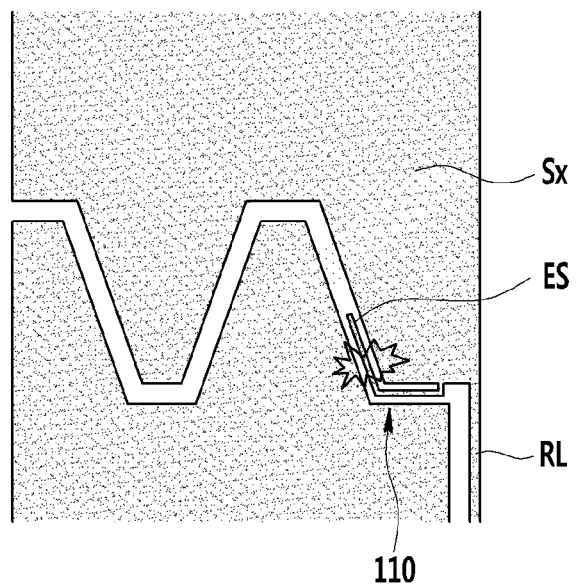
FIG. 6 is a layout view of a touch electrode and connection wiring included in a touch sensor according to an exemplary embodiment of the present invention.

The characteristics of the touch sensor according to the exemplary embodiment shown in FIG. 5 and FIG. 6 may be applied to the present exemplary embodiment.

According to another exemplary embodiment of the present invention, in the is exemplary embodiment shown in FIG. 9, FIG. 10, FIG. 12, and FIG. 14, the relative positions of the input touch electrode Tx and the output touch electrode Rx may be exchanged. In this case, the touch sensor may include at least one of electrostatic discharge protruding portions ES1 and ES2 protruding from the output touch electrode Rx.

According to another exemplary embodiment of the present invention, in the exemplary embodiment shown in FIG. 9, FIG. 10, FIG. 12, and FIG. 14, the output touch electrode Rx may also be divided into a plurality of output touch electrodes Rx disposed in each column, and may be connected to the sensing signal controller 800 through the connection wire RL. In this case, at least one of the electrostatic discharge protruding portions ES1 and ES2 may be connected to the output touch electrode Rx.

Figure 15:
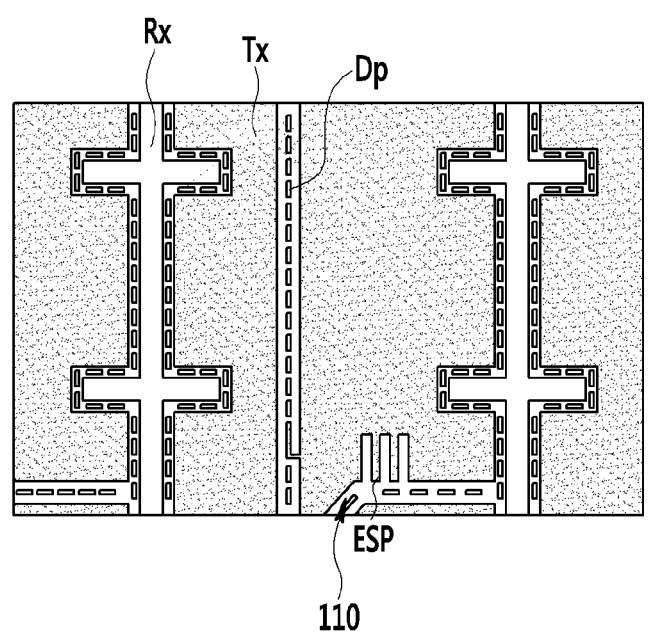
FIG. 15 is a partially enlarged view of the touch sensor shown in FIG. 10.

The touch sensor including the electrostatic discharge pattern 110 according to an exemplary embodiment of the present invention will now be described with reference to FIG. 15 as well as FIG. 9, FIG. 10, FIG. 12.

The touch sensor according to the present exemplary embodiment is similar to the above-described exemplary embodiment except for the electrostatic discharge pattern 110 included in the touch sensor. That is, the touch sensor according to the present exemplary embodiment includes input touch electrodes Tx and output touch electrodes Rx disposed in the touch region, and connection wires RL connected to input touch electrodes Tx. The connection part of the input touch electrodes Tx and the connection wires RL form the bottleneck portion in which the width of the connection part is abruptly decreased or increased, and includes the electrostatic discharge pattern 110 disposed adjacent the bottleneck portion.

The electrostatic discharge pattern 110 according to the present exemplary embodiment includes at least one electrostatic discharge comb pattern ESP formed at the input is touch electrode Tx near the connection part of the input touch electrode Tx and the connection wires RL, that is, the bottleneck portion.

The electrostatic discharge comb pattern ESP extends from the inside of the input touch electrode Tx to the outside thereof, and a gap of a preselected width is formed between portions of the electrostatic discharge comb pattern ESP or between the electrostatic discharge comb pattern ESP and the side of the main body of the input touch electrode Tx. The gap between the electrostatic discharge comb patterns ESP or between the electrostatic discharge comb pattern ESP and the side of the input touch electrode Tx is connected to the outer space of the touch electrode Sx.

The electrostatic discharge comb pattern ESP may extend substantially parallel to the edge side of the input touch electrode Tx adjacent the bottleneck portion, but the present invention is not limited thereto. The end part of the electrostatic discharge comb pattern ESP is not connected to other parts as well as the connection wires RL. When forming electrostatic discharge comb patterns ESP, they may extend substantially parallel to each other.

Each width of the electrostatic discharge comb patterns ESP may be equal to or less than the width of the connection wires RL. The length of the electrostatic discharge comb pattern ESP may be appropriately adjusted.

When forming the electrostatic discharge pattern 110 realized by at least one electrostatic discharge comb pattern ESP in the input touch electrode Tx adjacent the bottleneck portion where the input touch electrode Tx and the connection wires RL are connected, static electricity is induced by at least one electrostatic discharge comb pattern ESP such that the electrostatic discharge comb pattern ESP may be broken first by any overvoltage. Accordingly, the connection wires RL may be prevented from being broken by static electricity such that the is electrical connection between the input touch electrode Tx and the connection wires RL may be maintained and the touch sensor of the corresponding part may function normally.

The various characteristics of the touch sensor according to the exemplary embodiment shown in FIG. 7 and FIG. 8 may be applied to the present exemplary embodiment.

According to another exemplary embodiment of the present invention, the exemplary embodiment shown in FIG. 9, FIG. 10, FIG. 12, and FIG. 15, the relative positions of the input touch electrode Tx and the output touch electrode Rx may be exchanged. In this case, the touch sensor may include at least one electrostatic discharge comb pattern ESP.

According to another exemplary embodiment of the present invention, in the exemplary embodiment shown in FIG. 9, FIG. 10, FIG. 12, and FIG. 15, the output touch electrode Rx may also be divided into a plurality of output touch electrodes Rx disposed in each column, and may be connected to the sensing signal controller 800 through the connection wires RL. In this case, the output touch electrode Rx may also include at least one electrostatic discharge comb pattern ESP.

According to exemplary embodiments of the present invention, the touch electrode and the connection wire are protected from damage caused by static electricity that flows into the touch sensor, such that the touch sensor may normally sense touch in all regions.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A touch sensor, comprising:
 a touch panel comprising a touch region;
 touch electrodes disposed in the touch region and configured to sense a touch, the touch electrodes each comprising an electrostatic discharge pattern configured to discharge static electricity accumulated in the touch electrode; and
 connection wires respectively connected to the touch electrodes,
 wherein:
 a width of each of the connection wires is less than a width of each of the touch electrodes; and
 the electrostatic discharge pattern is disposed on the touch electrode and adjacent to the connection wire connected to the touch electrode.

2. The touch sensor of claim 1, wherein each electrostatic discharge pattern comprises a first electrostatic discharge path and a second electrostatic discharge path.

3. The touch sensor of claim 2, wherein the first electrostatic discharge path and the second electrostatic discharge path of each touch electrode are both directly connected to one of the connection wires.

4. The touch sensor of claim 3, wherein:
 the first electrostatic discharge path and the second electrostatic discharge path are adjacent to each other in the touch electrode; and
 an opening is formed between the first electrostatic discharge path and the second electrostatic discharge path.

5. The touch sensor of claim 4, wherein a width of the first electrostatic discharge path and the second electrostatic discharge path is equal to or less than the width of the connection wire.

6. The touch sensor of claim 5, wherein the width of the connection wire is equal to or greater than about 10 um, and equal to or less than about 100 um.

7. The touch sensor of claim 6, wherein the touch electrode comprises a transparent conductive material comprising ITO (indium tin oxide), IZO (indium zinc oxide), a metal nanowire, a conductive polymer, or a thin metal layer.

8. The touch sensor of claim 7, wherein the touch electrodes and the connection wires are disposed in the same layer.

9. The touch sensor of claim 1, wherein the electrostatic discharge patterns comprise an electrostatic discharge protruding portions protruding from the touch electrode.

10. The touch sensor of claim 9, wherein the electrostatic discharge protruding portion protrudes from the touch electrode and extends substantially parallel to an edge of the touch electrode or to the connection wire.

11. The touch sensor of claim 10, wherein the electrostatic discharge protruding portion comprises a first electrostatic discharge protruding portion and a second electrostatic discharge protruding portion that protrude from the touch electrode and extend in different directions from each other.

12. The touch sensor of claim 11, wherein a width of the electrostatic discharge protruding portion is equal to or less than the width of the connection wire.

13. The touch sensor of claim 12, wherein the width of the connection wire is equal to or greater than about 10 um, and equal to or less than about 100 um.

14. The touch sensor of claim 13, wherein the touch electrode comprises a transparent conductive material comprising ITO (indium tin oxide), IZO (indium zinc oxide), a metal nanowire, a conductive polymer, or a thin metal layer.

15. The touch sensor of claim 14, wherein the touch electrodes and the connection wire are disposed in the same layer.

16. The touch sensor of claim 1, wherein the electrostatic discharge pattern comprises an electrostatic discharge comb pattern formed in the touch electrode.

17. The touch sensor of claim 16, wherein the electrostatic discharge comb pattern extends from inside the touch electrode to outside thereof.

18. The touch sensor of claim 17, wherein the electrostatic discharge comb pattern is not directly connected to the connection wire.

19. The touch sensor of claim 18, wherein a width of the electrostatic discharge comb pattern is equal to or less than the width of the connection wire.

20. The touch sensor of claim 19, wherein the width of the connection wire is equal to or greater than about 10 um, and equal to or less than about 100 um.

* * * * *